United States Patent

Hirata

[11] Patent Number: 5,511,034
[45] Date of Patent: Apr. 23, 1996

[54] SIMPLE TEMPORARY INFORMATION STORAGE CIRCUIT CONTROLLABLE WITH ENABLE/RESET SIGNAL

[75] Inventor: Yutaka Hirata, Tokyo, Japan

[73] Assignee: NEC Corporation, Tokyo, Japan

[21] Appl. No.: 282,429

[22] Filed: Jul. 29, 1994

[30] Foreign Application Priority Data

Jul. 30, 1993 [JP] Japan ................................. 5-189931

[51] Int. Cl.$^6$ ........................................... G11C 8/00
[52] U.S. Cl. ............................. 365/230.06; 365/189.05
[58] Field of Search ......................... 365/230.08, 230.06, 365/230.02, 189.05, 174; 326/105

[56] References Cited

U.S. PATENT DOCUMENTS

| | | | |
|---|---|---|---|
| 4,951,259 | 8/1990 | Sato et al. | 365/230.06 |
| 5,128,897 | 7/1992 | McClure | 365/230.06 |
| 5,357,479 | 10/1994 | Matsui | 365/230.06 |
| 5,373,479 | 12/1994 | Noda | 365/230.06 |

FOREIGN PATENT DOCUMENTS 0370460  11/1989  European Pat. Off. .
2149163   6/1985  United Kingdom .

OTHER PUBLICATIONS

Patent Abstracts of Japan; vol. 10, No. 283 (E–440 (2339)); Sep. 26, 1986; JP-A-61 101 113 (Toshiba) May 20, 1986; abstract.
Patent Abstracts of Japan; vol. 9, No. 208 (E–338 (1931); Aug. 24, 1985; JP-A-60 070 817 (Hitachi) Apr. 22, 1985; abstract.

Primary Examiner—David C. Nelms
Assistant Examiner—A. Zarabian
Attorney, Agent, or Firm—Sughrue, Mion, Zinn, Macpeak & Seas

[57] ABSTRACT

Only a flip flop circuit (11a), an n-channel enhancement type transfer transistor (Qn11) coupled between an input node and the flip flop (11a) and a p-channel enhancement type reset transistor (Qp12) coupled between a power voltage line (Vcc) and the flip flop circuit (11a) form in combination a temporary information storage circuit, and the n-channel enhancement type transfer transistor (Qn11) and the p-channel enhancement type reset transistor (Qp12) are respectively controlled by a latch control signal (CTL2) and an enable/reset signal (EBL2) for changing the status of the flip flop circuit.

5 Claims, 7 Drawing Sheets

SIMPLE TEMPORARY INFORMATION STORAGE CIRCUIT CONTROLLABLE WITH ENABLE/RESET SIGNAL

FIELD OF THE INVENTION

This invention relates to a temporary information storage circuit and, more particularly, to a temporary information storage circuit controllable with an enable/reset signal.

DESCRIPTION OF THE RELATED ART

Figure 1:
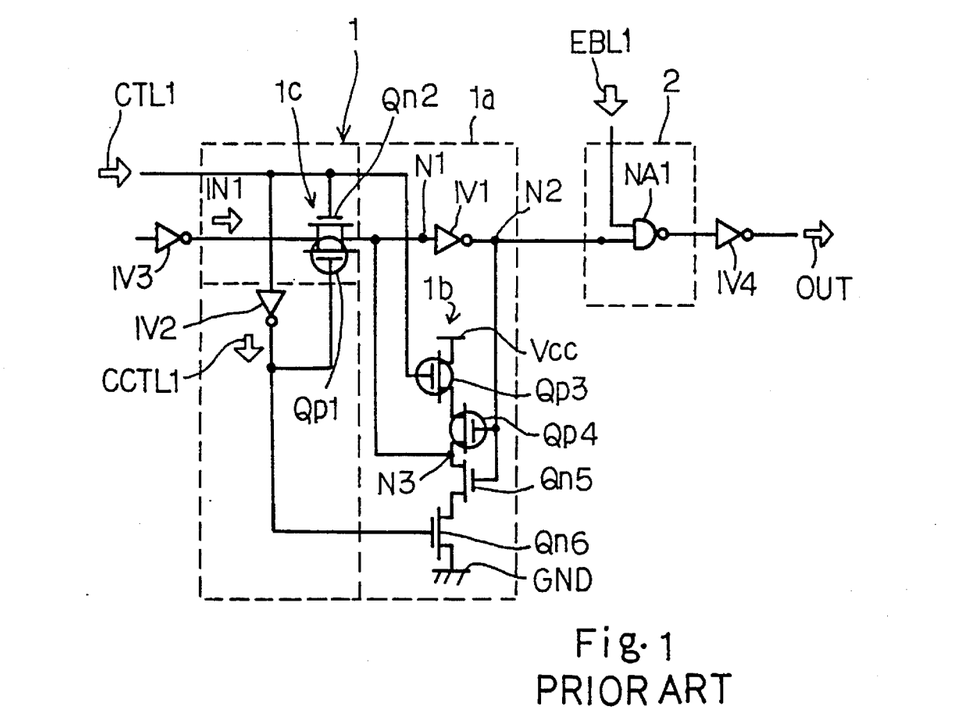
FIG. 1 is a circuit diagram showing the arrangement of the prior art temporary information storage circuit.

A typical example of the temporary information storage circuit device is illustrated in figure I of the drawings, and largely comprises a delayed latch circuit 1 responsive to a latch control signal CTL1 for storing an input signal IN1 and a reset circuit 2 responsive to an enable/reset signal EBL1 for controlling the output from the delayed latch circuit 1.

The delayed latch circuit 1 comprises a memory section la implemented by a loop of an inverter IV1 and a three-state buffer 1b, an inverter IV2 for producing a complementary signal CCTL1 of the latch control signal CTL1 and a transfer gate 1c coupled between an inverter IV3 and a memory section 1a, and an input signal IN1 is supplied from the inverter IV1 to the transfer gate 1c.

The transfer gate 1c is implemented by a parallel combination of a p-channel enhancement type switching transistor Qp1 and an n-channel enhancement type switching transistor Qn2 coupled between the output node of the inverter IV3 and an input node N1 of the memory circuit 1a. While the latch control signal CTL1 remains in the high voltage level, the p-channel enhancement type switching transistor Qp1 and the n-channel enhancement type switching transistor Qn2 turn on, and the input signal IN1 is transferred to the input node N1. On the other hand, if the latch control signal CTL1 is changed to a low voltage level, the transfer gate 1c electrically isolates the input node N1 from the inverter IV3.

The three-state buffer 1b is a series combination of p-channel enhancement type switching transistors Qp3 and Qp4 and n-channel enhancement type switching transistors Qn5 and Qn6 coupled between a power voltage line Vcc and a ground voltage line GND.

The latch control signal CTL1 and the complementary signal CCTL1 are supplied to the gate electrode of the p-channel enhancement type switching transistor Qp3 and the gate electrode of the n-channel enhancement type switching transistor Qn6. If the latch control signal CTL1 is in the high voltage level, the p-channel enhancement type switching transistor Qp3 and the n-channel enhancement type switching transistor Qn6 turn off so that the three state buffer 1b enters into a floating state. On the other hand, while the latch control signal CTL1 remains in the low voltage level, the p-channel enhancement type switching transistor Qp3 and the n-channel enhancement type switching transistor Qn6 turn on, and the p-channel enhancement type switching transistor Qp4 and the n-channel enhancement type switching transistor Qn5 become responsive to the voltage level at the output node N2 of the inverter IV1. The p-channel enhancement type switching transistor Qp4 and the n-channel enhancement type switching transistor Qn5 invert the voltage level at the output node N2, and returns the inverted voltage level from the output node N3 to the input node N1.

The reset circuit 2 is implemented by a NAND gate, and is enabled with the enable/reset signal EBL1 of the high voltage level indicative of logic "1" level. While the NAND gate NA1 is being enabled, the voltage level at the output node N2 indicative of the input signal IN1 is inverted by the NAND gate NA1, and the inverted voltage level is transferred from the NAND gate NA1 to an inverter IV4. The inverter IV4 produces an output signal OUT1. On the other hand, if the enable/reset signal EBL1 is changed to the low voltage level indicative of logic "0" level, the NAND gate NA1 changes the output node thereof to the high voltage level regardless of the voltage level at the output node N2, and cancels the stored input signal IN1.

Figure 2:
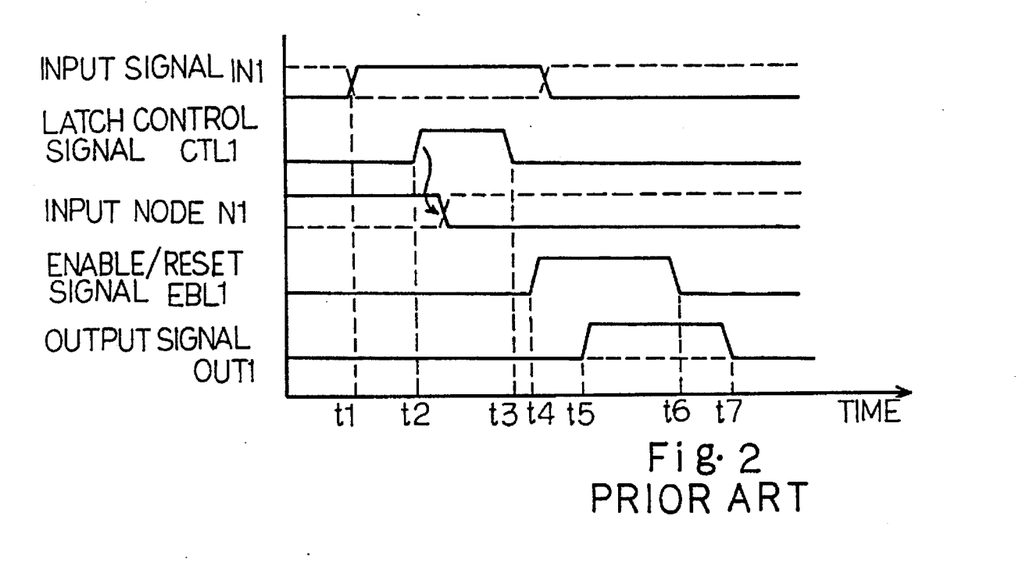
FIG. 2 is a timing chart showing the circuit behavior of the prior art temporary information storage circuit.

FIG. 2 illustrates the circuit behavior of the prior art temporary information storage circuit. The enable/reset signal EBL1 is assumed to initially remain in the low voltage level indicative of the reset state, and the inverter IV4 keeps the output signal OUT1 in the low voltage level. The latch control signal CTL1 also remains in the low voltage level, and the transfer gate 1c is turned off so that the memory circuit 1a is blocked from the input signal IN1. For this reason, even if the input signal IN1 is changed at time t1, the input node N1 keeps the previous voltage level.

The latch control signal CTL1 is changed to the high voltage level at time t2, and the transfer gate 1c turns on for transferring the input signal IN1 to the input node N1 of the inverter IV1. The latch control signal CTL1 further causes the three state buffer 1b to enter into the floating state, and, accordingly, allows the inverter IV1 to change the voltage level N2 depending upon the newly supplied input signal IN1. However, the enable/reset signal EBL1 still keeps the NAND gate NA1 in the reset state.

The latch control signal CTL1 is recovered from the high voltage level at time t3 so that the transfer gate 1c turns off. The latch control signal CTL1 of the low voltage level enables the three state buffer 1b, and changes the voltage level at the output node N3 depending upon the input signal N2 at the output node N2. The inverter IV1 and the three state buffer 1b form the memory loop, and keeps the voltage level at the output node N2 indicative of the newly supplied input signal IN1.

The enable/reset signal EBL1 is changed to the high voltage level indicative of the enabled state at time t4, and the NAND gate NA1 becomes responsive to the voltage level at the output node N2. The NAND gate NA1 changes or keeps the voltage level at the output node thereof, and the inverter IV4 produces the output signal OUT1 indicative of the newly supplied input signal IN1 at time t5.

If the enable/reset signal EBL1 is recovered from the high voltage level to the low voltage level at time t6, the NAND gate NA1 forcibly changes the output node thereof to the high voltage level, and the inverter IV4 cancels the output signal OUT1 at time t7.

Figure 3:
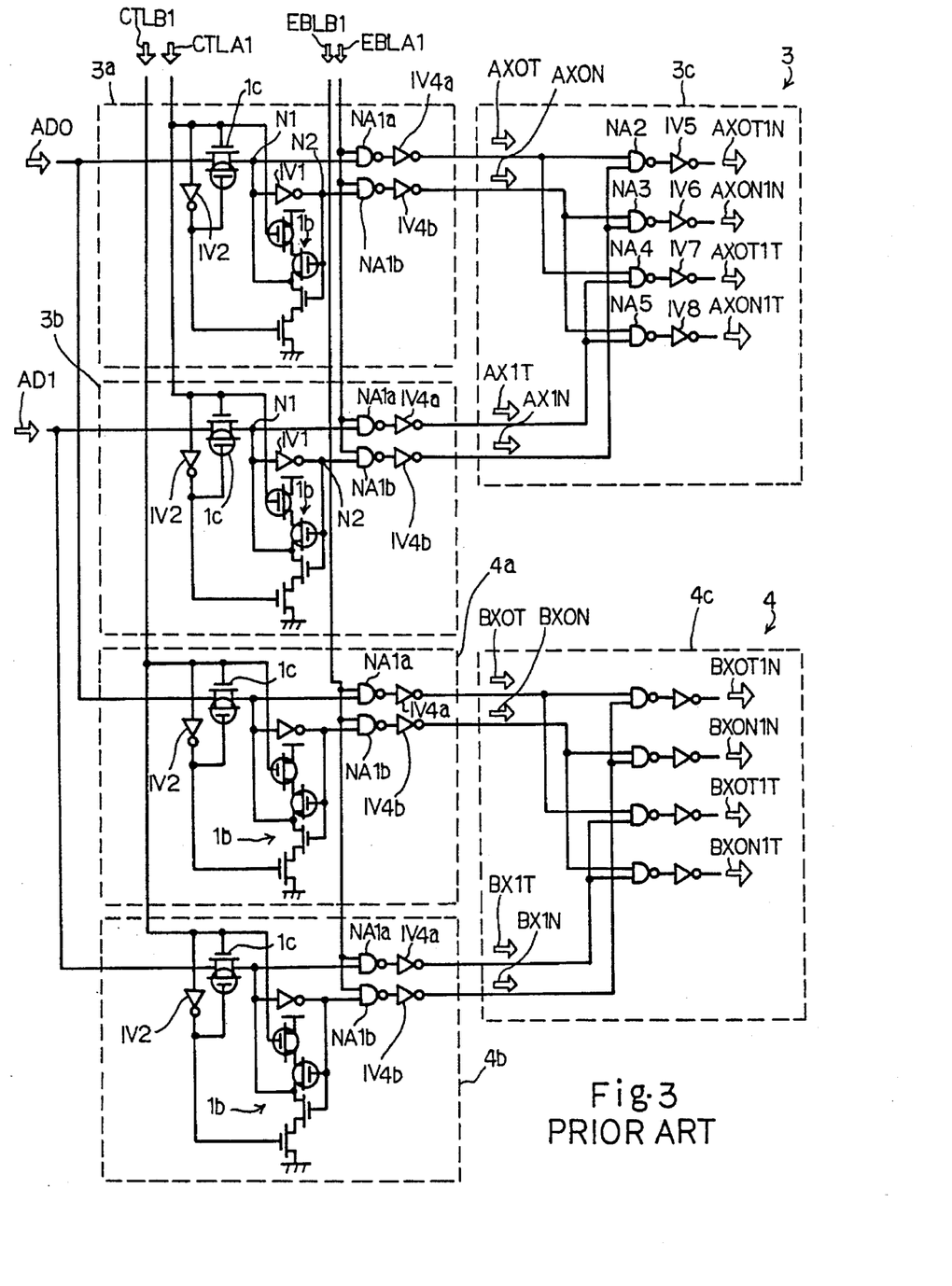
FIG. 3 is a circuit diagram showing the arrangement of the prior art addressing system.

The prior art temporary information storage circuit is available for an addressing system incorporated in a semiconductor memory device, and FIG. 3 illustrates the arrangement of the prior art addressing system. The prior art addressing system is broken down into a row addressing sub-system 3 and a column addressing sub-system 4, and an address input circuit (not shown) is shared between the row addressing sub-system 3 and the column addressing sub-system 4. For this reason, input address bits AD0 and AD1 are indicative of not only a row address but also a column address.

The row addressing sub-system 3 comprises row address buffer/predecoder units 3a and 3b and a row address decoder unit 3c, and the prior art temporary information storage circuit ½ are slightly modified for address predecoding. Namely, the NAND gate NA1 is dualized, and the two NAND gates NA1a and NA1b are respectively coupled to the input node N1 and the output node N2 of the inverter IV1. The NAND gates NA1a and NA1b are respectively coupled to the inverters IV4a and IV4b, and row address predecoded signals AX0T/AX1T and AX0N/AX1N are supplied from the inverters IV4a and IV4b of the row address buffer/predecoder units 3a and 3b to the row address decoder unit 3c.

The row address decoder unit 3c comprises two-input NAND gates NA2, NA3, NA4 and NA5 and inverters IV5, IV6, IV7 and IV8, and the inverters IV5 to IV8 are respectively coupled to word lines (not shown). The row address predecoded signals AX0T, AX1T, AX0N and AX1N are selectively supplied to the NAND gates NA2 to NA5, and one of the NAND gates NA2 to NA5 changes the output node thereof to the active low voltage level. Accordingly, the associated inverter IV5, IV6, IV7 or IV8 changes the word line to the active high voltage level with one of the row address decoded signals AX0T1N, AX0N1N, AX0T1T and AX0N1T.

The column addressing sub-system 4 also comprises column address buffer/predecoder units 4a and 4b and a column address decoder unit 4c. The column address buffer/predecoder units 4a and 4b are similar in arrangement to the row address buffer/predecoder units 3a and 3b, and produce column address predecoded signals BX0T, BX0N, BX1T and BX1N from the address bits AD0 and AD1 indicative of a column address. The column address decoder unit 4c is also analogous to the row address decoder unit 3c, and selectively changes column address decoded signals BX0T1N, BX0N1N, BX0T1T and BX0N1T to an active level.

Though not shown in FIG. 3, a controller is provided for the addressing system, and the controller selectively supplies the latch control signals CTLA1 and CTLB1 and the enable/reset signals EBLA1 and EBLB1. Namely, an external device firstly supplies the address bits AD0 and AD1 indicative of a row address, and the controller sequentially changes the latch control signal CTLA1 and the enable/reset signal EBLA1 to the active level. Then, the row address buffer/predecoder units 3a and 3b latch the address bits AD0 and AD1 indicative of the row address, and produce the row address predecoded signals AX0T to AX1N. However, while the address input circuit is storing the address bits AD0 and AD1 for the row addressing sub-system, the controller keeps the latch control signal CTLB1 and the enable-reset signal EBLB1 inactive, and the column addressing sub-system stands idle.

If the external device thereafter supplies the address bits AD0 and AD1 indicative of a column address, the controller changes the latch control signal CTLB1 and the enable/reset signal EBLB1 to the active level, and keeps the latch control signal CTLA1 and the enable/reset signal EBLA1 to the inactive low voltage level. The column address buffer/predecoder units 4a and 4b produces the column address predecoded Signals BX0T to BX1N from the address bits AD0 and AD1, and the column address decoder unit 4c changes one of the column address decoded signals BX0T1N, BX0N1N, BX0T1T and BX0N1T to the active level.

The prior art temporary information storage encounters a problem in a large number of circuit components. In fact, the prior art temporary information storage circuit requires the transfer gate 1c, the three state buffer 1b, the two inverters IV1 and IV2 and the NAND gate NA1.

Figure 4:
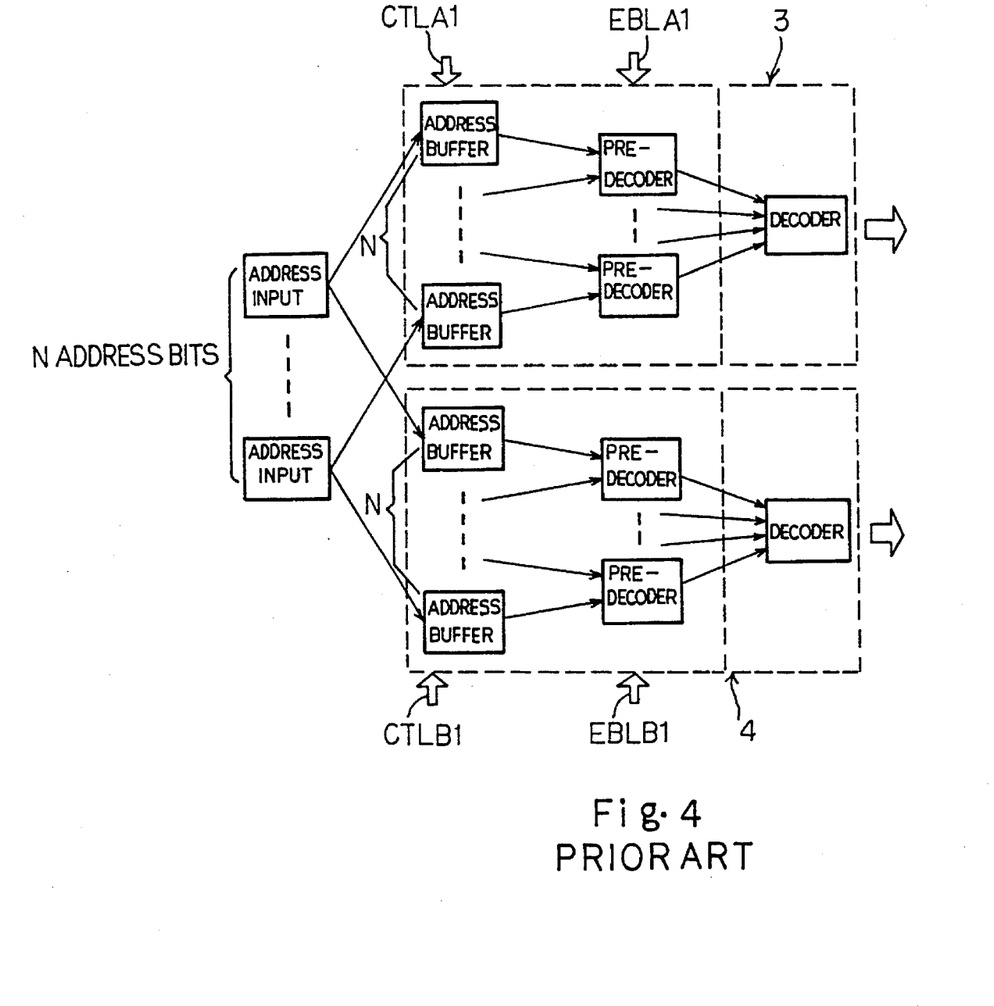
FIG. 4 is a block diagram showing the arrangement of the prior art addressing system.

If the prior art temporary information storage circuits form parts of the addressing system for a semiconductor memory device in the next generation, the number of the prior art temporary information storage circuits is increased twice as many as the required address bits. For example, if the address bits are n, each address bit is supplied to the row addressing sub-system 3 and the column addressing sub-system 4 as shown in FIG. 4, and 2n address buffers and 2n predecoders are required for the row and column addressing sub-systems 3 and 4. This results in that the temporary information storage circuits occupy a large amount of real estate of the semiconductor substrate. Such a large amount of occupation area enlarges the semiconductor substrate, and deteriorates the production yield.

SUMMARY OF THE INVENTION

It is therefore an important object of the present invention to provide a temporary information storage circuit which is implemented by a small number of circuit components.

To accomplish the object, the present invention proposes to reset a bit of stored information by coupling a memory loop to a constant voltage source.

In accordance with the present invention, there is provided a temporary information storage circuit comprising: a) a transfer transistor responsive to a first control signal so as to provide a signal path for an input signal indicative of a piece of information; b) a bistable circuit having an input node coupled to the transfer transistor, and responsive to the input signal for changing an output signal thereof; and c) a switching transistor coupled between a source of constant voltage and the input node of the bistable circuit, and responsive to a second control signal so that the bistable circuit forcibly changes the output signal to a certain level corresponding to the piece of information in the enabled state and to a reset level regardless of the piece of information in the reset state.

The temporary information storage circuit may form a part of an addressing system incorporated in, for example, a semiconductor memory device.

BRIEF DESCRIPTION OF THE DRAWINGS

The features and advantages of the temporary information storage circuit according to the present invention will be more clearly understood from the following description taken in conjunction with the accompanying drawings in which.

DESCRIPTION OF THE PREFERRED EMBODIMENT

Resettable Latch Circuit

Figure 5:
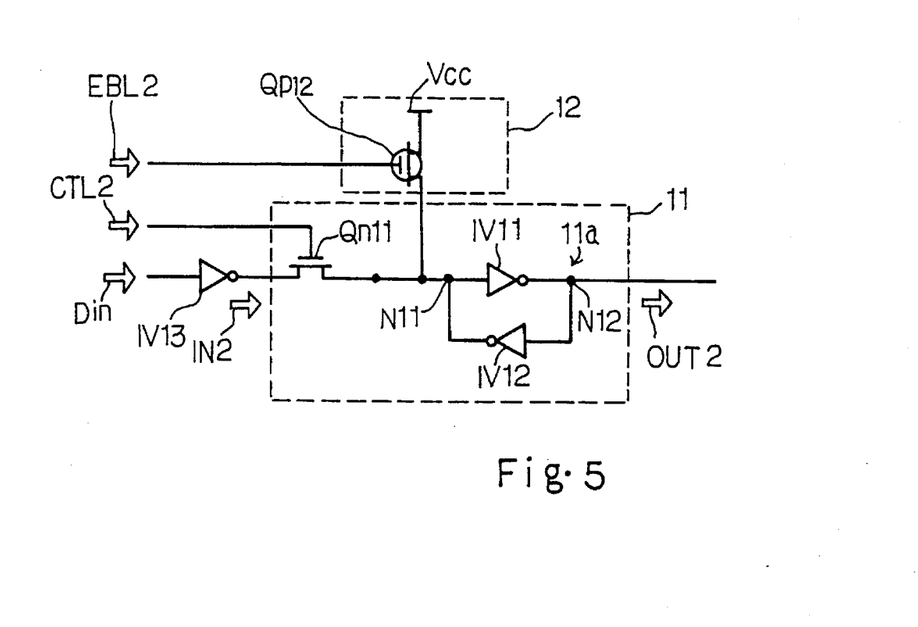
FIG. 5 is a circuit diagram showing the arrangement of a temporary information storage circuit according to the present invention.

Referring to FIG. 5 of the drawings, a temporary information storage circuit embodying the present invention largely comprises a latch circuit 11 and a reset circuit 12, and a latch control signal CTL2 and a enable/reset signal EBL2 control the latch circuit 11 and the reset circuit 12, respectively.

The latch circuit 11 comprises an n-channel enhancement type transfer transistor Qn11 gated by the latch control signal CTL2 and a flip flop 11a having an input node N11 and an output node N12. The flip flop 11a is implemented by two inverters IV11 and IV12, and the inverters IV11 and IV12 are coupled between the input node N11 and the output node N12 in opposite directions.

While the latch control signal CTL2 remains in the low voltage level, the n-channel enhancement type transfer transistor Qn11 is turned off, and the inverters IV11 and IV12 maintain a voltage level at the input node N11 indicative of the previous input signal IN2.

If the latch control signal CTL2 is changed to the high voltage level, the n-channel enhancement type transfer transistor Qn11 turns on, and the input signal IN2 is transferred from an inverter IV13 to the input node N11 of the flip flop 11a so that the newly supplied input signal IN2 is stored in the flip flop 11a. In this instance, the inverter IV13 and the n-channel enhancement type transfer transistor Qn11 are larger in current driving capability than the inverter IV12, and, for this reason, the voltage level at the input node N11 is changeable regardless of the output node of the inverter IV12.

The reset circuit 12 is implemented by a p-channel enhancement type; switching transistor Qp12 coupled between a power voltage line Vcc and the input node N11, and the p-channel enhancement type switching transistor Qp12 is gated by the enable/reset signal EBL2.

While the enable/reset signal EBL2 remains in the high voltage level, the signal EBL2 is indicative of the enabled state, and the latch circuit 11 changes the voltage level at the output node N12 depending upon the input signal IN2 transferred to the input node N11. On the other hand, if the enable/reset signal EBL2 is changed to the low voltage level indicative of the reset state, the p-channel enhancement type switching transistor Qp12 turns on, and the input node N11 is forcibly changed to or maintained at the high voltage level regardless of the previous input signal IN2. Thus, the temporary information storage circuit is resettable and temporary stores a pieces of information represented by the input signal IN2. In this instance, the latch control signal CTL2 and the enable/reset signal EBL2 serve as the first control signal and the second control signal, respectively, and the flip flop circuit 11a is the bistable circuit.

Only two field effect transistors Qn11 and Qp12 and two inverters IV11 and IV12 form the resettable temporary information storage circuit, and the circuit components are surely decreased over the prior art temporary information storage circuit.

Figure 6:
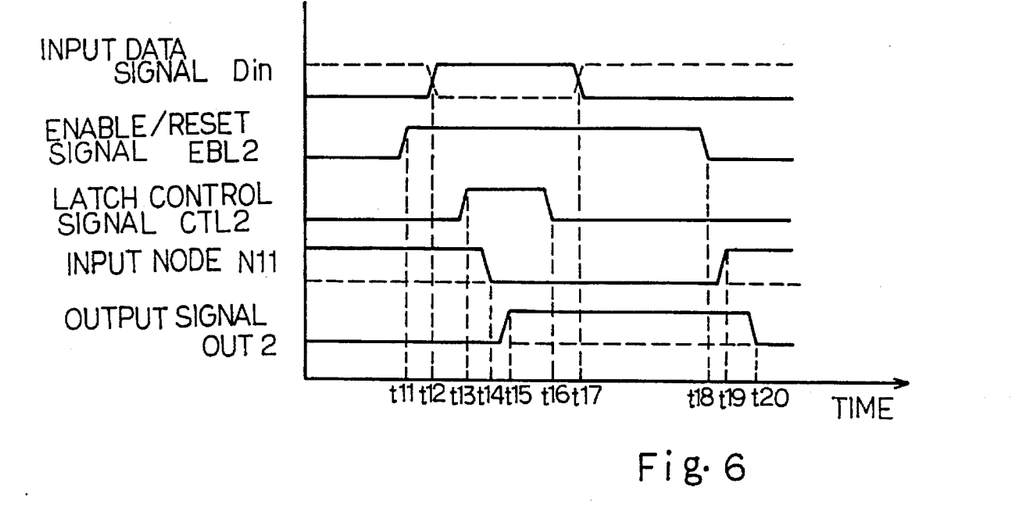
FIG. 6 is a timing chart showing the circuit behavior of the temporary information storage circuit shown in FIG. 5.

FIG. 6 illustrates the circuit behavior of the temporary information storage circuit shown in FIG. 4. While the enable/reset signal EBL2 remains in the low voltage level indicative of the reset state, the p-channel enhancement type switching transistor Qp12 is turned on, and the input node N11 is forcibly charged to the high voltage level. As a result, the output signal OUT is fixed to the low voltage level.

If the enable/reset signal EBL2 is changed to the high voltage level indicative of the enabled state at time t11, the p-channel enhancement type switching transistor Qp12 turns off, and the latch circuit 11 is enabled by being isolated from the power voltage line Vcc.

An input data signal Din is changed from the low voltage level to the high voltage level at time t12, and, accordingly, the inverter IV13 produces the input signal IN2 of the low voltage level. However, the input node N11 is still maintained at the high voltage level indicative of the previous input signal IN2, because the n-channel enhancement type transfer transistor Qn11 is turned off.

If the latch control signal CTL2 is changed from the low voltage level to the high voltage level at time t13, the n-channel enhancement type transfer transistor Qn11 turns on, and the input signal IN2 reaches the input node N11. As a result, the input node N11 is decayed to the low voltage level at time t14.

The low voltage level indicative of the input signal IN2 is stored in the flip flop circuit 11a, and the flip flop circuit 11a changes the output signal OUT2 to the high voltage level at time t15.

After the input signal IN2 is stored in the flip flop circuit 11a, the latch control signal CTL2 is recovered to the low voltage level at time t16, and the input node N11 is isolated from the inverter IV13. For this reason, even if the input data signal Din is changed to the low voltage level at time t17, the voltage level at the input node N11 is not changed.

The enable/reset signal EBL2 is changed to the low voltage level indicative of the reset state at time t18, and the p-channel enhancement type switching transistor Qp12 turns on for charging the input node N11. The input node N11 reaches the high voltage level at time 19, and the inverter IV11 changes the output signal OUT2 to the low voltage level at time t20.

Addressing System

Figure 7:
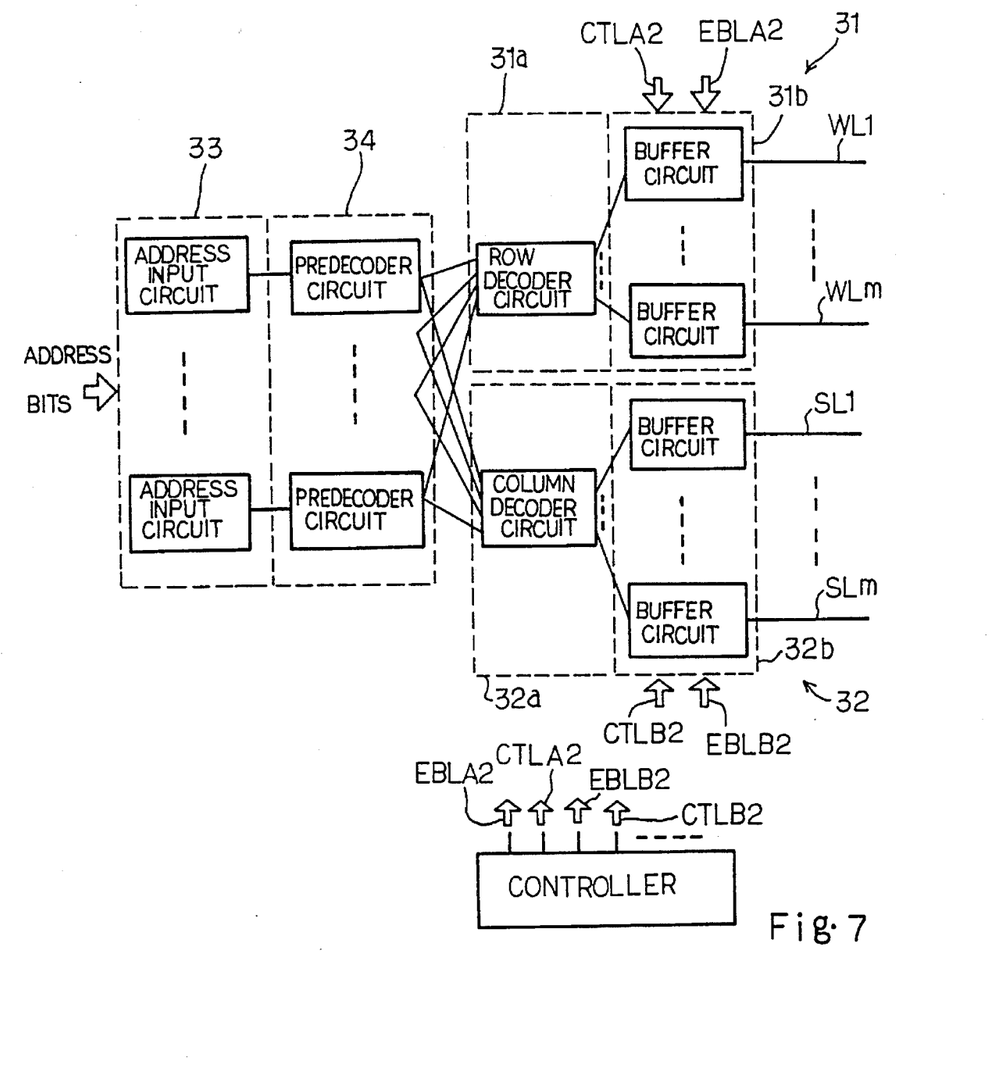
FIG. 7 is a block diagram showing the arrangement of an addressing system according to the present invention.

Turning to FIG. 7 of the drawings, an addressing system embodying the present invention is broken down into a row addressing sub-system 31 and a column addressing sub-system 32, and address input circuits 33 and address predecoder circuits 34 are shared between the row addressing sub-system 31 the column addressing sub-system 32.

A row address decoder circuit 31a and address buffer circuits 31b are exclusive to the row addressing sub-system 31, and a column address decoder 32a and address buffer circuits 32b are exclusive to the column addressing sub-system 32. The address buffer circuits 31b are respectively associated with word lines WL1 to WLm, and selectively drive the word lines WL1 to WLm. The address buffer circuits 32b are respectively coupled to selector control lines SL1 to SLm, and selectively drive the selector control lines SL1 to SLm. The latch control signal CTLA2 and the enable/reset signal EBLA2 are supplied to the address buffer circuits 31a of the row addressing sub-system 31, and the address buffer circuits 32a are controlled by the latch control signal CTLB2 and the enable/reset signal EBLB2.

When an external device supplies the address bits indicative of a row address, the shared address input circuits 33 receive the address bits, and the shared address predecoder circuits 34 produces address predecoded signals from the address bits. The address predecoded signals indicative of the row address are supplied in parallel to the :cow address decoder circuit 31a and the column address decoder circuit 32a, and the row address decoder circuit 31a and the column address decoder circuit 32a change one of the row address decoded signal lines and one of the column address decoded signal lines to an active level.

The enable/reset signal EBLA2 changes the address buffer circuits 31b to the enabled stage, and the latch control signal CTLA2 allows the address buffer circuits 31b to temporarily store the address predecoded signals. For this reason, one of the word lines WL1 to WLm is driven to the active level, and the other word lines remain inactive. However, the other latch control signal CTLB2 and the other enable/reset signal EBLB2 keeps the address buffer circuits 32a disable, and the address predecoded signals are never stored in the address buffer circuits 32b. As a result, the selector control lines SL1 to SLm are maintained in the reset level.

The enable/reset signal EBLA2 is, thereafter, changed to the voltage level indicative of the reset state, and the buffer circuits 31b keep all of the word lines inactive.

Subsequently, the external device supplies the address bits indicative of a column address to the shared address input circuits 33, and the shared address predecoder circuits 34 produce the address predecoded signals indicative of the column address. Each of the row and column address decoders 31a and 32a shifts one of the decoded signal lines as similar to the previous addressing.

However, only the enable/reset signal EBLB2 allows the address buffer circuits 32b to enter into the enabled state, and the address buffer circuits 32b store the column address decoded signals in response to the latch control signal CTLB2. However, the other enable/reset signal EBLA2 maintains the address buffer circuits 31b disable, and no word line is driven to the active level.

One of the address buffer circuits 32b drives one of the selector control lines SL1 to SLm to the active level, and the other address buffer circuits maintain the associated selector control lines in the inactive level.

When the enable/reset signal EBLB2 is changed to the voltage level indicative of the reset state, the address buffer circuits 32b change all of the selector control lines SL1 to SLm to the inactive level.

Thus, only the address decoders 31a/32a and the address buffer circuits 31b/32b are dualized, and the addressing system according to the present invention is simpler than the prior art addressing system. Even if the address bits are indicative of more than two addresses, the addressing system according to the present invention is not so enlarged as the prior art addressing system.

Figure 8:
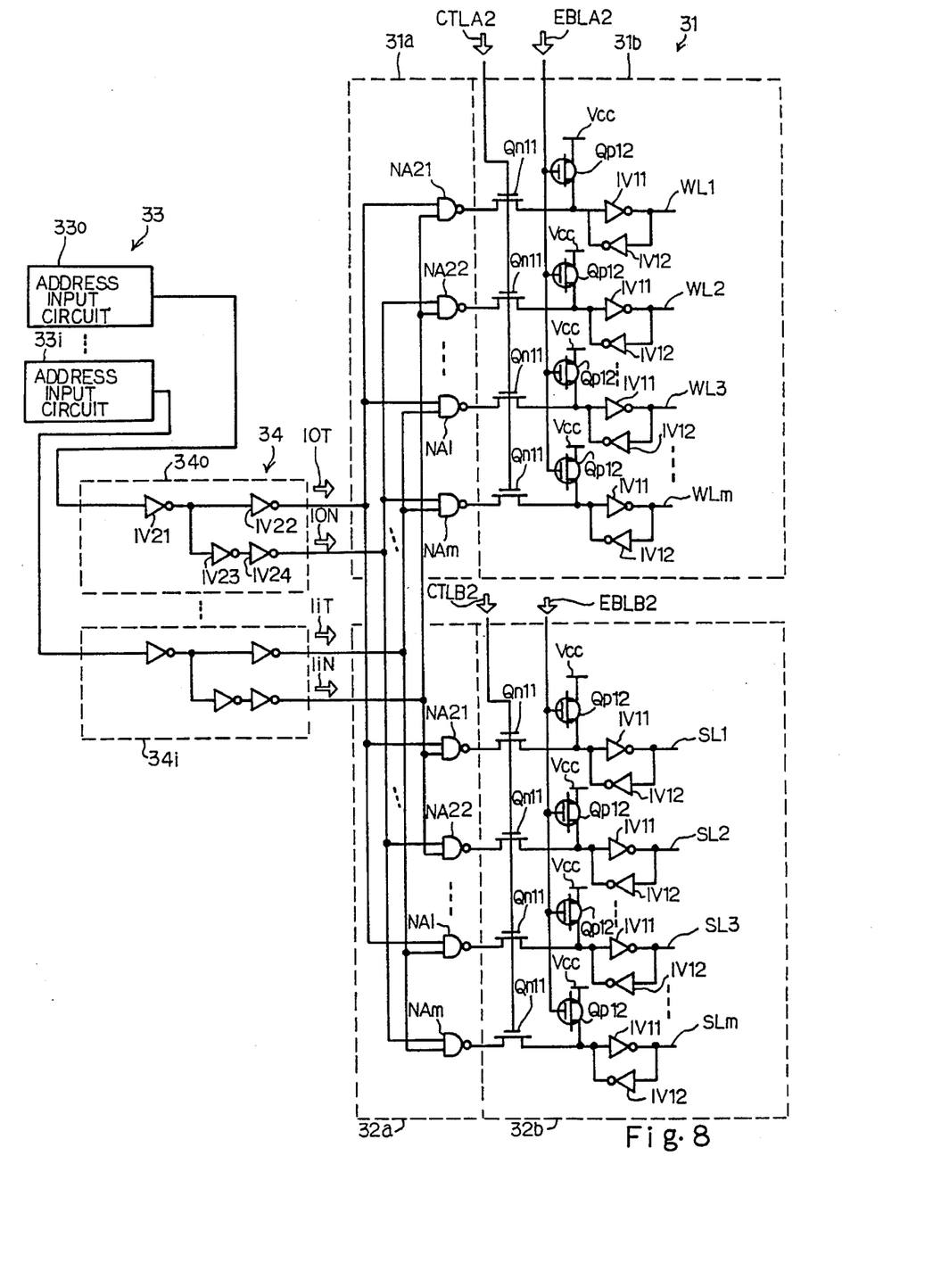
FIG. 8 is a circuit diagram showing the circuit arrangement of a first example of the addressing system.

FIG. 8 illustrates a first example of the addressing system according to the present invention. The address input circuits 33o to 33i respectively relay the i address bits to the associated address predecoder circuits 34o to 34i. All of the address predecoder circuits 34o to 34i are similar in arrangement to one another, and each address predecoder circuit comprises a first series combination of inverters IV21 and IV22 and a second series combination of inverters IV23 and IV24 for producing a true and complementary address predecoded signals I0T/I0N, . . . or IiT/IiN.

The row address decoder circuit 31a and the column address decoder circuit 32a are similar in circuit arrangement, and each address decoder 31a or 32a are implemented by an array of two-input NAND gates NA21, NA22, . . . , NA1 and NAm. The address predecoded signals I0T/I0N to IiT/IiN are selectively supplied to the two-input NAND gates NA21 to NAm of the row address decoder circuit 31a and the two-input NAND gates NA21 to NAm of the column address decoder circuit 32a in parallel.

The address buffer circuits 31b and the address buffer circuits 32b are similar in arrangement to the temporary information storage circuit shown in FIG. 5, and the circuit components are labeled with the same references as those of the temporary information storage circuit.

The circuit behavior of the first example is similar to that of the addressing system shown in FIG. 7, and no further description is incorporated hereinbelow.

Figure 9:
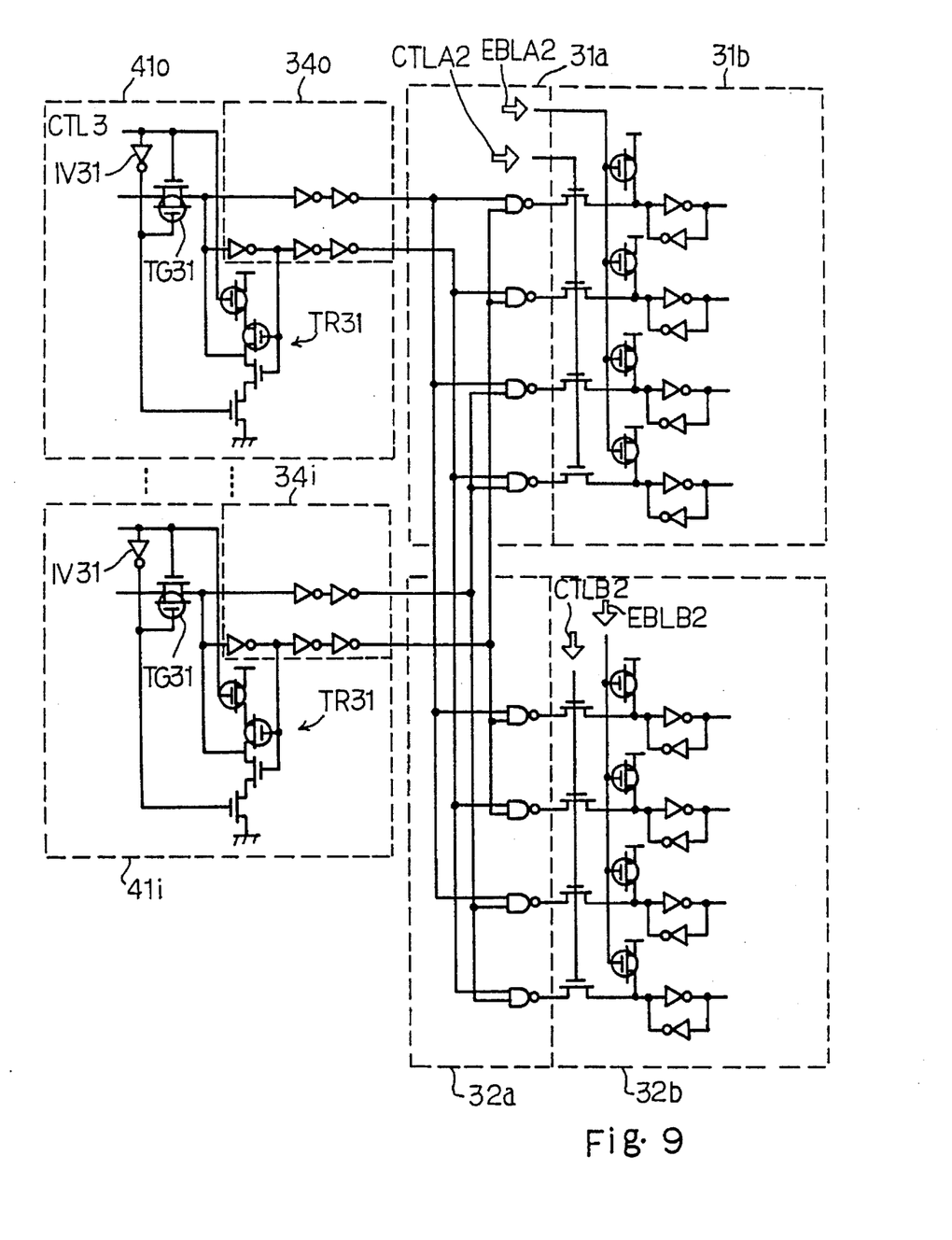
FIG. 9 is a circuit diagram showing the circuit arrangement of a second example of the addressing system.

Turning to FIG. 9 of the drawings, a second example of the addressing system according to the present invention is illustrated. The second example is similar to the first example except for delayed latch circuits 41o and 41i respectively associated with the address predecoder circuits 34o to 34i. The other component circuits are similar to those of the first example, and no further description on the other circuits is incorporated hereinbelow.

All of the delayed latch circuits 41o to 41i are similar in arrangement to one another, and each delayed latch circuit comprises an inverter IV, a transfer gate TG31 and a three state buffer TR31. The transfer gate TG31 and the three state buffer TR31 are controlled by a pre-latch control signal CTL3 for rapidly latching address bits indicative of a row address. The latch timing of the row address bits fox the first example is delayed rather than the latch timing for the prior art addressing system, because the address buffer circuits 31b latch the row address decoded signals. However, the second example latches the row address bits before the address predecoding, and the delayed latch circuits 41o to 41i accelerate the row addressing sequence.

As will be appreciated from the foregoing description, only two transistors and two inverters form the temporary information storage circuit according to the present invention, and the temporary information storage circuits form a simple addressing system. The simple addressing system occupies a small amount of real estate, and a manufacturer can fabricate a semiconductor memory device on a small semiconductor substrate.

Although particular embodiments of the present invention have been shown and described, it will be obvious to those skilled in the art that various changes and modifications may be made without departing from the spirit and scope of the present invention. For example, the two transistors of the temporary information storage circuit may be opposite in conductivity type to those shown in FIG. 5, and the address predecoder circuits, the row and column address decoder circuits and the delayed latch circuits are not limited to those of the first and second examples.

What is claimed is:

1. An addressing system comprising a plurality of address predecoder circuits for producing address predecoded signals from address bits indicative of a plurality of addresses in a time division multiplexing sequence, a first address decoder unit coupled to said plurality of address predecoders for producing first address decoded signals, a plurality of first temporary information storage circuits responsive to a first and a second control signals in a first phase for temporarily storing said first address decoded signals, a second address decoder unit coupled to said plurality of address predecoders for producing second address decoded signals, and a plurality of second temporary information storage circuits responsive to said first and second control signals in a second phase after said first phase for temporarily storing said second address decoded signals.

2. The temporary information storage circuit as set forth in claim 1, in which said addressing system further comprising a plurality of delayed latch circuits respectively associated with said plurality of address predecoder circuits for temporarily storing said address bits indicative of an address firstly supplied in the time division multiplexing sequence.

3. The addressing system of claim 1, wherein each of said plurality of first temporary information storage circuits and each of said plurality of second temporary information storage circuits comprises:

a) a transfer transistor responsive to a first control signal so as to provide a signal path for an input signal indicative of a piece of information;

b) a bistable circuit having an input node coupled to said transfer transistor, and responsive to said input signal for changing an output signal thereof; and c) a switching transistor coupled between a source of constant voltage and said input node of said bistable circuit, and responsive to a second control signal so that said bistable circuit forcibly changes said output signal to a certain level corresponding to said piece of information in an enabled state and to a reset level regardless of said piece of information in a reset state.

4. The addressing system as set forth in claim 3, wherein said bistable circuit is a flip flop circuit implemented by two inverters having respective input nodes and respective output nodes, one of said input nodes and one of said output nodes being coupled to said input node of said bistable circuit, the other of said input node being coupled to the other of said output node where said output signal is produced, one of said two inverters being smaller in current driving capability than a source of said input signal and said transfer transistor so that said input signal can change the voltage level at said input node of said bistable circuit.

5. The addressing system as set forth in claim 4, wherein said switching transistor is a p-channel enhancement type switching transistor gated by said second control signal, said second control signal designating said enable state by a high voltage level, to thereby keep said switching transistor in an off state.

* * * * *

UNITED STATES PATENT AND TRADEMARK OFFICE
CERTIFICATE OF CORRECTION

PATENT NO. : 5,511,034
DATED      : Apr. 23, 1996
INVENTOR(S) : Yutaka Hirata

It is certified that error appears in the above-indentified patent and that said Letters Patent is hereby corrected as shown below:

Column 6, line 60, delete ":cow" and insert --row--.

Signed and Sealed this

Twenty-third Day of July, 1996

Attest:

BRUCE LEHMAN

*Attesting Officer*      *Commissioner of Patents and Trademarks*